United States Patent
Kasa (10) Patent No.: US 8,878,129 B1
(45) Date of Patent: Nov. 4, 2014

(54) PATTERN MEASUREMENT APPARATUS AND PATTERN MEASUREMENT METHOD

(71) Applicant: Kabushiki Kaisha Toshiba, Tokyo (JP)

(72) Inventor: Kentaro Kasa, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/196,697

(22) Filed: Mar. 4, 2014

(30) Foreign Application Priority Data

Sep. 9, 2013 (JP) .................... 2013-186729

(51) Int. Cl.
*H01J 37/28* (2006.01)
*H01J 37/21* (2006.01)
*H01J 37/26* (2006.01)

(52) U.S. Cl.
CPC ............ *H01J 37/28* (2013.01); *H01J 37/21* (2013.01); *H01J 37/26* (2013.01)
USPC ........... 250/310; 250/306; 250/307; 250/309; 250/397; 250/398

(58) Field of Classification Search
USPC ............ 250/310, 306, 307, 309, 397, 398
See application file for complete search history.

(56) References Cited

U.S. PATENT DOCUMENTS

| | | | | |
|---|---|---|---|---|
| 4,803,357 A * | 2/1989 | Brust | ............ | 250/310 |
| 4,845,362 A * | 7/1989 | Sicignano et al. | ............ | 250/310 |
| 6,657,203 B2 * | 12/2003 | Koike | ............ | 250/398 |
| 7,122,388 B2 * | 10/2006 | Han | ............ | 438/17 |
| 7,138,629 B2 * | 11/2006 | Noji et al. | ............ | 250/311 |
| 7,166,840 B2 * | 1/2007 | Takane et al. | ............ | 250/311 |
| 7,368,749 B2 * | 5/2008 | Han | ............ | 257/48 |
| 8,148,682 B2 | 4/2012 | Hotta et al. | | |
| 8,629,394 B2 * | 1/2014 | Madokoro et al. | ............ | 250/306 |
| 2001/0006216 A1 | 7/2001 | Koike | | |
| 2003/0085352 A1 * | 5/2003 | Lezec et al. | ............ | 250/306 |
| 2003/0223630 A1 | 12/2003 | Adel et al. | | |
| 2007/0114398 A1 * | 5/2007 | Miyamoto et al. | ............ | 250/307 |
| 2011/0139980 A1 * | 6/2011 | Nakano et al. | ............ | 250/307 |
| 2011/0155904 A1 | 6/2011 | Hotta et al. | | |
| 2011/0297826 A1 * | 12/2011 | Madokoro et al. | ............ | 250/307 |
| 2013/0026361 A1 * | 1/2013 | Yamanashi et al. | ............ | 250/307 |
| 2013/0035888 A1 * | 2/2013 | Kandel et al. | ............ | 702/81 |

FOREIGN PATENT DOCUMENTS

| | | |
|---|---|---|
| JP | 9-180667 | 7/1997 |
| JP | 2002-13922 | 1/2002 |
| JP | 2005-156487 | 6/2005 |
| JP | 2013-30277 | 2/2013 |

* cited by examiner

*Primary Examiner* — David A Vanore
(74) *Attorney, Agent, or Firm* — Finnegan, Henderson, Farabow, Garrett & Dunner, L.L.P.

(57) ABSTRACT

According to one embodiment, a pattern measurement apparatus includes a scan controller, a focus controller, a stage, a sensor, a signal processor, and a measurement unit. The scan controller is configured to control a scanning direction of an electron beam. The focus controller is configured to control a focus position of the electron beam. The stage is configured to have a substrate placed on the stage, a pattern being provided in the substrate. The sensor is configured to sense secondary electrons due to the electron beam irradiated onto the pattern. The signal processor is configured to process a signal sensed by the sensor. The signal processor is configured to determine at least one of third signals from at least one of first signals and at least one of second signals. The measurement unit is configured to measure a position of the pattern from the third signals.

20 Claims, 6 Drawing Sheets

| ACCELERATION VOLTAGE (V) | CURRENT (pA) | FOCUS (μm) | THRESHOLD | COORDINATE |
|---|---|---|---|---|
| 800 | 8 | 0 | Th1 | x1 |
| 800 | 8 | 0 | Th2 | x2 |
| 800 | 8 | 0 | Th3 | x3 |
| 400 | 8 | 0 | Th1 | x4 |
| 400 | 8 | 0 | Th2 | x5 |
| 400 | 8 | 0 | Th3 | x6 |
| ⋮ | ⋮ | ⋮ | ⋮ | ⋮ |

PATTERN MEASUREMENT APPARATUS AND PATTERN MEASUREMENT METHOD

CROSS-REFERENCE TO RELATED APPLICATIONS

This application is based upon and claims the benefit of priority from Japanese Patent Application No. 2013-186729, filed on Sep. 9, 2013; the entire contents of which are incorporated herein by reference.

FIELD

Embodiments described herein relate generally to a pattern measurement apparatus and a pattern measurement method.

BACKGROUND

A lithography process that is used to manufacture a semiconductor device, etc., includes forming the pattern of an upper layer by using a pattern (e.g., an overlay mark) formed beforehand in a wafer or the like as a reference to perform a high-precision alignment. The overlay precision of the pattern affects the characteristics of the device that is manufactured. Therefore, after performing the lithography process, the overlay error of the pattern is measured and fed back to the lithography process.

The overlay error of the pattern is measured by measuring a position of a dedicated pattern having dimensions that are different from those of a normal circuit pattern. Higher-precision measuring of such a pattern is possible by using a scanning electron microscope that has a resolution that is higher than that of an optical microscope. It is important to further increase the precision of the measurement of the pattern using the scanning electron microscope.

DETAILED DESCRIPTION

According to one embodiment, a pattern measurement apparatus includes a scan controller, a focus controller, a stage, a sensor, a signal processor, and a measurement unit. The scan controller is configured to control a scanning direction of an electron beam. The focus controller is configured to control a focus position of the electron beam. The stage is configured to have a substrate placed on the stage, a pattern being provided in the substrate. The sensor is configured to sense secondary electrons due to the electron beam irradiated onto the pattern. The signal processor is configured to process a signal sensed by the sensor. The signal processor is configured to determine at least one of third signals from at least one of first signals and at least one of second signals. The at least one of the first signals is obtained by the sensor by the electron beam being scanned by the scan controller in a first direction. The at least one of the second signals is obtained by the sensor by the electron beam being scanned by the scan controller in a second direction opposite to the first direction. A signal difference caused by the scanning direction of the electron beam is suppressed for the at least one of the third signals. The measurement unit is configured to measure a position of the pattern from the third signals.

Various embodiments will be described hereinafter with reference to the accompanying drawings. In the description hereinbelow, similar members are marked with like reference numerals, and a description is omitted as appropriate for members once described.

First Embodiment

Figure 1:
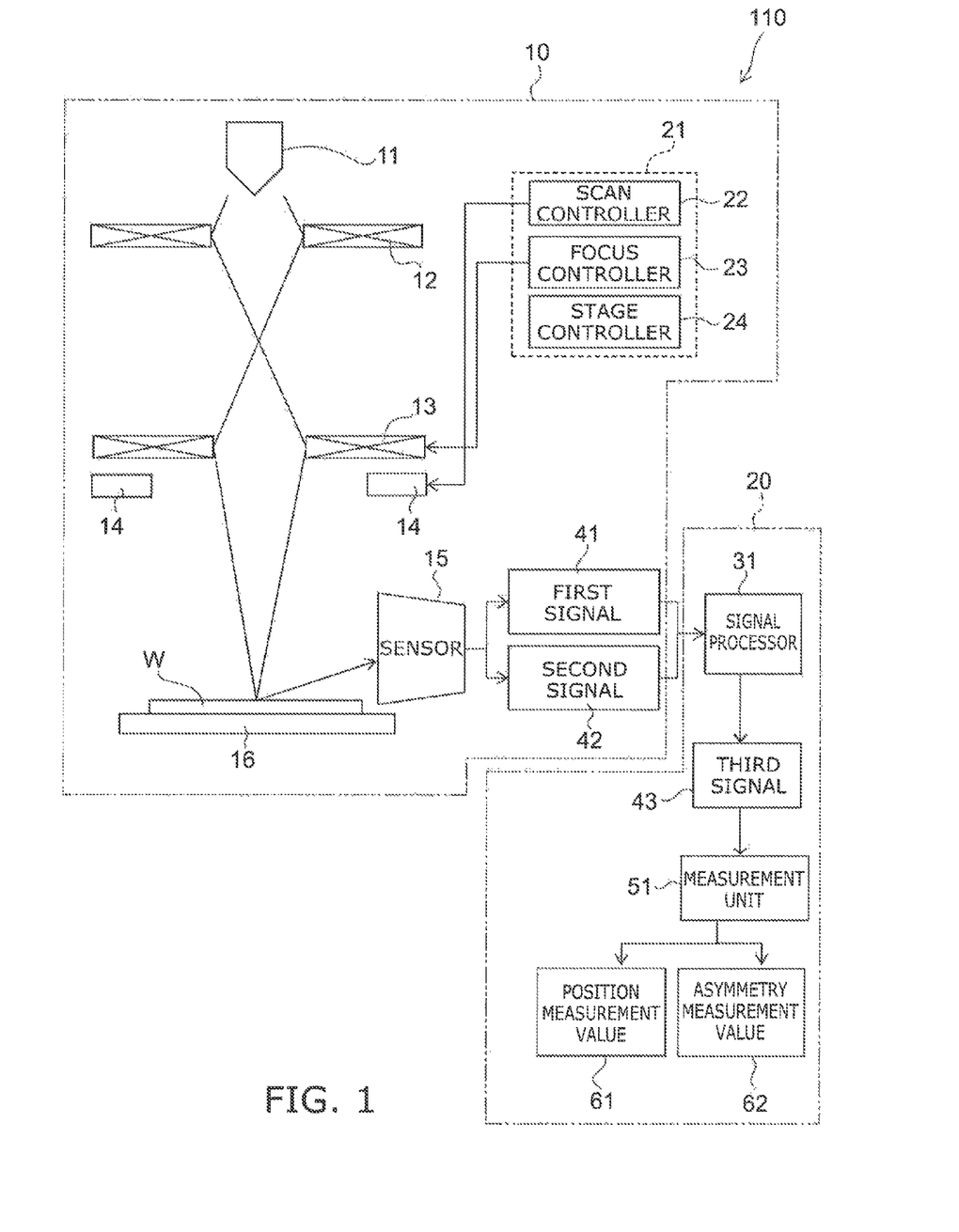
FIG. 1 is a schematic view illustrating the configuration of a pattern measurement apparatus according to a first embodiment.

FIG. 1 is a schematic view illustrating the configuration of a pattern measurement apparatus according to a first embodiment.

As shown in FIG. 1, the pattern measurement apparatus 110 according to the embodiment includes a scan controller 22, a focus controller 23, a stage 16, a sensor 15, a signal processor 31, and a measurement unit 51.

The pattern measurement apparatus 110 according to the embodiment has parts included in a scanning electron microscope 10 and parts included in an image signal processor 20. The scan controller 22, the focus controller 23, the stage 16, and the sensor 15 are included in the scanning electron microscope 10. The signal processor 31 and the measurement unit 51 are included in the image signal processor 20.

The scanning electron microscope 10 further includes an electron gun 11, a condenser lens 12, an objective lens 13, and a scanning coil 14. The electron gun 11 includes a filament of tungsten, etc. The electron gun 11 emits electrons from the filament.

The condenser lens 12 and the objective lens 13 are electron lenses. The condenser lens 12 focuses the electrons emitted from the electron gun 11. The objective lens 13 further focuses the electrons focused by the condenser lens 12 to perform the role of aligning the focal point at a prescribed position on the measurement object. The scanning coil 14 scans the electrons in prescribed directions. In the embodiment, one prescribed direction in which the electrons are scanned is called a first direction; and the direction that is opposite to the first direction is called the second direction. In the embodiment, the scanning direction of the electrons is taken as a x-direction; and a direction orthogonal to the scanning direction of the electrons is taken as a y-direction.

The scanning electron microscope 10 includes an apparatus controller 21 that controls each unit. The apparatus controller 21 may be realized by a computer. The apparatus controller 21 includes the scan controller 22, the focus controller 23, and a stage controller 24.

The scan controller 22 controls the scanning direction of the electron beam. The scan controller 22 controls the scanning direction of the electrons (the electron beam) emitted from the electron gun 11 by controlling the current flowing in the scanning coil 14. The focus controller 23 controls the focus position of the electron beam. The focus controller 23 controls the current flowing in the objective lens 13 to control the focus position of the electron beam.

The stage controller 24 controls the position of the stage 16. A drive mechanism (not shown) is provided in the stage 16. The drive mechanism is, for example, a mechanism that drives the stage 16 along the x-axis, the y-axis, and the z-axis (an axis orthogonal to the x-axis and the y-axis). The stage controller 24 controls the position of the stage 16 along the x, y, and z-axes by providing control signals to the drive mechanism.

A substrate such as a wafer W or the like that includes a pattern is placed on the stage 16. The sensor 15 senses the secondary electrons due to the electron beam irradiated onto the pattern. The sensor 15 outputs an electrical signal corresponding to the amount of the sensed secondary electrons. In the pattern measurement apparatus 110 according to the embodiment, the sensor 15 outputs a first signal 41 and a second signal 42 that are described below.

The signal processor 31 receives the first signal 41 and the second signal 42 output from the sensor 15 and performs prescribed signal processing. The first signal 41 is at least one signal obtained by the sensor 15 by the electron beam being scanned in the first direction by the scan controller 22. The first signal 41 is a portion of a two-dimensional image signal obtained when the electron beam is scanned in the first direction. For example, the first signal 41 is a signal that indicates the strength of one prescribed line in the x-direction of the two-dimensional image signal.

The second signal 42 is at least one signal obtained by the sensor 15 by the electron beam being scanned by the scan controller 22 in the second direction that is opposite to the first direction. The second signal 42 is a portion of a two-dimensional image signal obtained when the electron beam is scanned in the second direction. For example, the second signal 42 is a signal that indicates the strength of one prescribed line in the x-direction of the two-dimensional image signal.

The first signal 41 may be multiple signals obtained using different electron irradiation conditions; and the second signal 42 may be multiple signals obtained using different electron irradiation conditions. For example, the focus position of the electrons may be multiply set; and the multiple first signals 41 and the multiple second signals 42 may be obtained at each of the focus positions.

The signal processor 31 determines a third signal 43 by, for example, averaging the first signal 41 and the second signal 42. The third signal 43 is at least one signal for which the difference between the first signal 41 and the second signal 42 caused by the scanning direction of the electron beam is suppressed. Multiple third signals 43 are determined in the case where the third signal 43 is determined from multiple first signals 41 and multiple second signals 42.

The measurement unit 51 performs processing to measure the position of the pattern from the third signal 43 determined by the signal processor 31. The measurement unit 51 determines the coordinate of the center position of the pattern of the measurement object from the third signal 43. For example, thresholds of prescribed y-direction coordinates are set for the third signal 43; and the x coordinate of the center position of the pattern is determined from the x-direction coordinates where the third signal intersects the thresholds. The measurement unit 51 outputs the x coordinate of the center position of the pattern as a position measurement value 61.

For example, in the case where the multiple third signals 43 are determined, the measurement unit 51 may determine the average of the x coordinates obtained from each of the multiple third signals 43 and use the average as the position measurement value 61.

Also, the measurement unit 51 may determine the degree of asymmetry of the pattern of the measurement object from the third signal 43. The measurement unit 51 outputs the degree of asymmetry of the pattern as an asymmetry measurement value 62.

In the pattern measurement apparatus 110 according to the embodiment, the position of the pattern can be measured with high precision by suppressing the difference of the detection signals of the sensor 15 caused by the scanning direction of the electron beam.

Operations of the pattern measurement apparatus 110 according to the embodiment will now be described.

First, an image of the pattern is acquired by the scanning electron microscope 10. In the pattern measurement apparatus 110, multiple images having mutually-different scanning directions are acquired by the scanning direction of the electron beam being controlled by the scan controller 22.

FIG. 2A to FIG. 2D are schematic views illustrating image signals of the pattern.

Figure 2A:
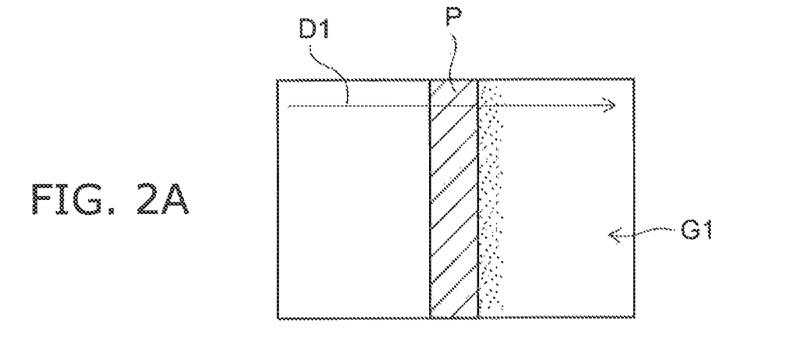
FIG. 2A to FIG. 2D are schematic views illustrating image signals of the pattern.
Figure 2B:
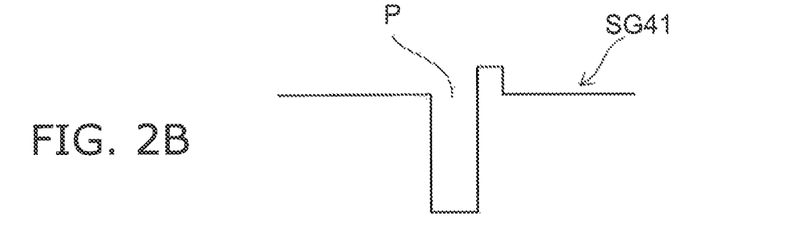

First, as shown in FIG. 2A, the pattern measurement apparatus 110 scans the electron beam in a first direction D1, irradiates the electron beam onto a pattern P, and acquires the image (a first image G1) of the pattern P. FIG. 2B shows the strength of the signal of one prescribed line of the first image G1.

Figure 2C:
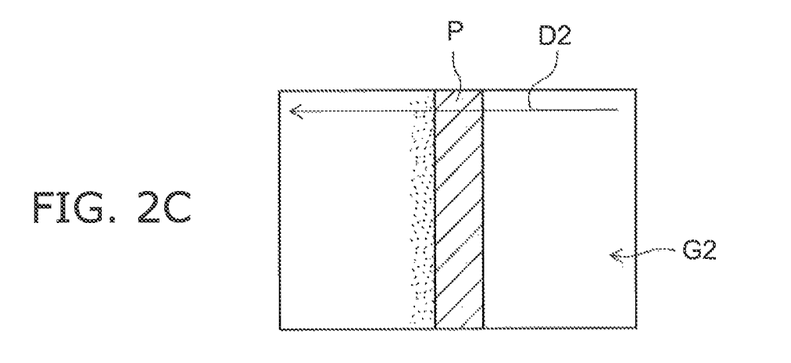
Figure 2D:
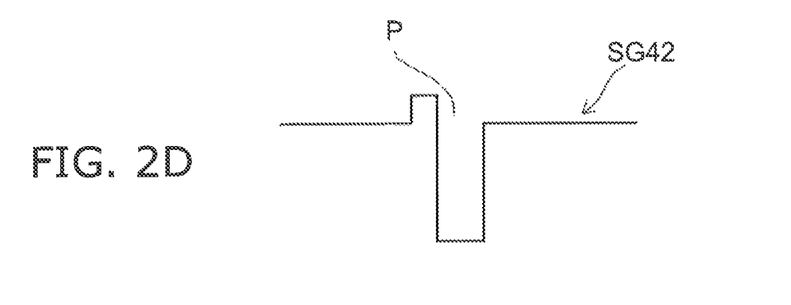

Then, as shown in FIG. 2C, the pattern measurement apparatus 110 scans the electron beam in a second direction D2 that is opposite to the first direction D1, irradiates the electron beam onto the pattern P, and acquires the image (a second image G2) of the pattern P. FIG. 2D shows the strength of the signal of one prescribed line of the second image G2.

In the case where the first image G1 and the second image G2 are acquired by scanning the electron beam in the scanning electron microscope 10, charging effects are caused by the scanning directions (the first direction D1 and the second direction D2) of the electron beam. The charging effects appear in the first image G1 and the second image G2 as distortions that do not exist in the actual pattern P.

For example, in the first image G1 shown in FIG. 2A, the downstream side of the pattern P in the first direction D1 is displayed as being brighter than the upstream side. As shown in FIG. 2B, the strength (a first signal SG41) of the signal of the one prescribed line of the first image G1 has a portion on the right side of the pattern P where the strength is high.

In the second image G2 shown in FIG. 2C, the downstream side of the pattern P in the second direction D2 is displayed as being brighter than the upstream side. As shown in FIG. 2D, the strength (a second signal SG42) of the signal of the one prescribed line of the second image G2 has a portion on the left side of the pattern P where the strength is high.

In other words, when the scanning directions of the electron beam are different from each other by 180°, the distortions of the images appear to be inverted from each other as in the first image G1 and the second image G2 shown in FIG. 2A and FIG. 2B.

Then, the signal processor 31 of the pattern measurement apparatus 110 determines the third signal by processing the first signal SG41 and the second signal SG42.

FIG. 3A to FIG. 3D are schematic views illustrating the signal processing.

Figure 3A:
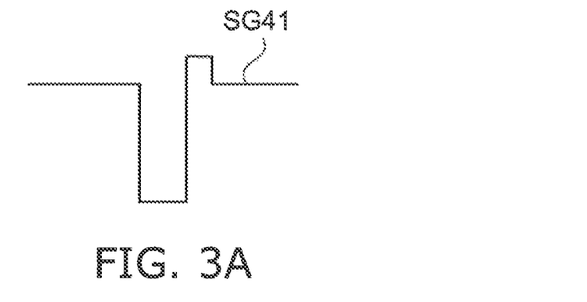
FIG. 3A to FIG. 3D are schematic views illustrating the signal processing.
Figure 3B:
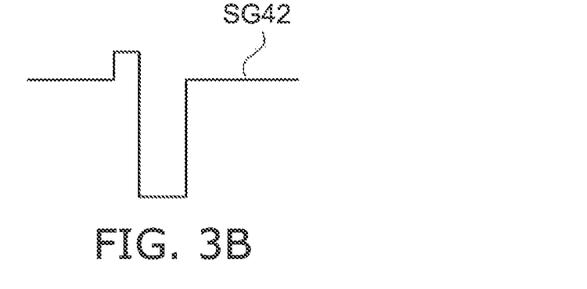

The first signal SG41 is shown in FIG. 3A; and the second signal SG42 is shown in FIG. 3B.

Figure 3C:
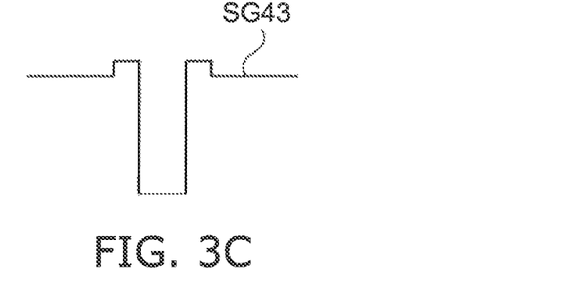

The signal processor 31 generates the third signal by, for example, determining the average of the first signal SG41 and the second signal SG42. A third signal G43 is shown in FIG. 3C. The third signal G43 is the signal obtained by averaging the first signal SG41 shown in FIG. 3A and the second signal SG42 shown in FIG. 3B. In a third signal SG43, the distortions of the first signal SG41 and the second signal SG42 that are caused by the scanning direction of the electron beam are suppressed.

In other words, the first signal SG41 and the second signal SG42 for which the scanning directions of the electron beam are different from each other by 180° have line symmetry around the pattern P. By utilizing this principle to determine the average of the first signal SG41 and the second signal SG42, the asymmetric locations of the first signal SG41 and the second signal SG42 are distributed. Thereby, the distortion that is caused by the scanning direction of the electron beam is suppressed.

Figure 3D:
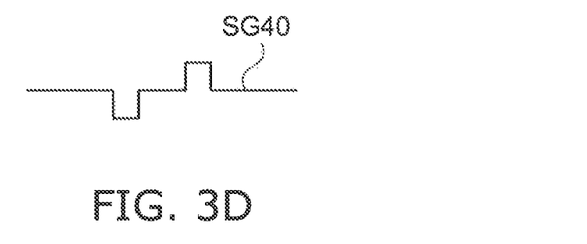

The signal processor 31 may determine the difference between the first signal SG41 and the second signal SG42. In FIG. 3D, a differential signal SG40 between the first signal SG41 and the second signal SG42 is shown. The signal processor 31 and the measurement unit 51 may perform the desired processing using the differential signal SG40.

In the pattern measurement apparatus 110, the first image G1 of the first direction D1 and the second image G2 of the second direction D2 are acquired; and the third signal SG43, for which the distortion that is caused by the scanning direction of the electron beam is suppressed, is determined from the first signal SG41 and the second signal SG42. The measurement unit 51 can perform a pattern measurement having high precision for which the distortion caused by the scanning direction of the electron beam is suppressed by measuring the position of the pattern using the third signal SG43.

The error of a measurement based on the pattern configuration will now be described.

Figure 4A:
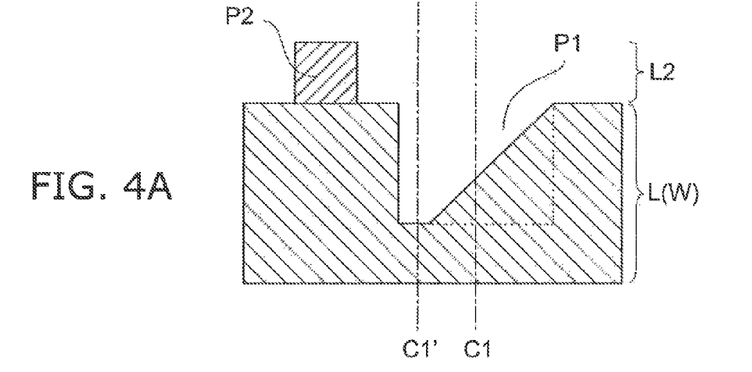
FIG. 4A and FIG. 4B illustrate the measurement based on the pattern configuration.
Figure 4B:
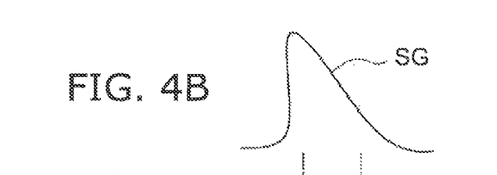

FIG. 4A and FIG. 4B illustrate the measurement based on the pattern configuration.

FIG. 4A is a schematic cross-sectional view of a first pattern P1 and a second pattern P2. FIG. 4B shows a signal SG of the pattern P1.

The first pattern P1 is provided in a first layer L1. The first layer L1 is, for example, the wafer W. The first pattern P1 is, for example, an alignment mark provided in the wafer W. The second pattern P2 is provided in a second layer L2. The second layer L2 is, for example, an interconnect layer formed on the wafer W. The second pattern P2 is, for example, an alignment mark provided in the interconnect layer. The images of the first pattern P1 and the second pattern P2 are acquired by the scanning electron microscope 10; and the shift of the overlay is determined by measuring the position of the pattern for the first pattern P1 and the second pattern P2.

As shown in FIG. 4A, the first pattern P1 has a configuration that is different from the original configuration of the first pattern P1. That is, processing such as CMP (Chemical Mechanical Polishing), etc., of the wafer W has caused an asymmetry in the first pattern P1, which originally is rectangular in the cross-sectional view.

In the case where the image of the distorted first pattern P1 is acquired by the scanning electron microscope 10 and a center position C1' of the first pattern P1 is determined from the signal SG based on the image, an error occurs between the center position C1' and a center position C1 of the original first pattern P1.

Figure 5A:
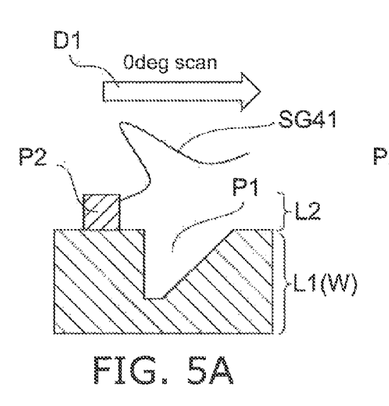
FIG. 5A to FIG. 5C are schematic views illustrating signal processing using the distorted pattern.
Figure 5B:
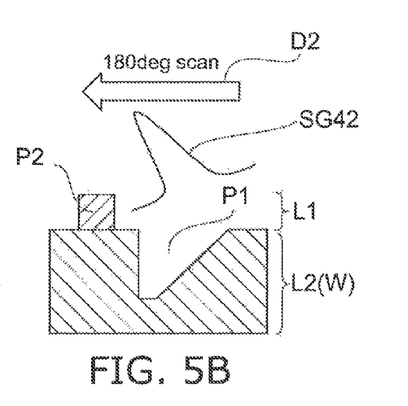
Figure 5C:
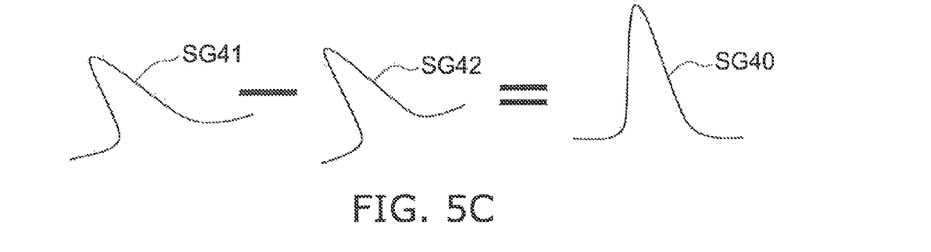

FIG. 5A to FIG. 5C are schematic views illustrating signal processing using the distorted pattern.

A first signal G41 that is obtained by scanning the electron beam in the first direction D1 is shown in FIG. 5A; and a second signal G42 that is obtained by scanning the electron beam in the second direction D2 is shown in FIG. 5B. The asymmetry of the configuration of the first pattern P1 and the distortion caused by the scanning direction of the first direction D1 are superimposed onto the first signal SG41. Also, the asymmetry of the configuration of the first pattern P1 and the distortion caused by the scanning direction of the second direction D2 are superimposed onto the second signal SG42.

FIG. 5C shows the differential signal SG40 in which the difference between the first signal SG41 and the second signal SG42 is determined. In the pattern measurement apparatus 110 according to the embodiment, the distortions of the first signal SG41 and the second signal SG42 that are caused by the scanning direction of the electron beam are suppressed by the signal processor 31 performing the prescribed signal processing on the first signal SG41 and the second signal SG42. The signal processor 31 uses the differential signal SG40 to suppress the distortion caused by the scanning direction of the electron beam. Also, the signal processor 31 may determine the third signal SG43 obtained from the average of the first signal SG41 and the second signal SG42.

Because the signal processor 31 uses the signal (e.g., the third signal SG43) for which the distortion caused by the scanning direction of the electron beam is suppressed, the measurement unit 51 can measure the position of the first pattern P1 with high precision.

In the case where the electron beam is irradiated by scanning the electron beam onto a pattern having an asymmetric cross section as in the first pattern P1 shown in FIGS. 5A and 5B, the signal that is acquired by the scanning electron microscope 10 has a complex distortion due to the asymmetry of the cross section and the distortion caused by the scanning direction of the electron beam.

In the pattern measurement apparatus 110 according to the embodiment, the distortion caused by the scanning direction of the electron beam is effectively suppressed when using the signal including such a complex distortion. Accordingly, a signal can be obtained for which the asymmetry of the cross section is reflected sufficiently; and the position and/or the degree of asymmetry of the first pattern P1 can be measured with high precision.

In the pattern measurement apparatus 110, the measurement of the position and/or degree of asymmetry of the second pattern P2 is performed similarly to the measurement of the position and/or degree of asymmetry of the first pattern P1. Also, the overlay error of the first layer L1 and the second layer L2 may be inspected using the shift of the positions of the two patterns.

Figure 6:
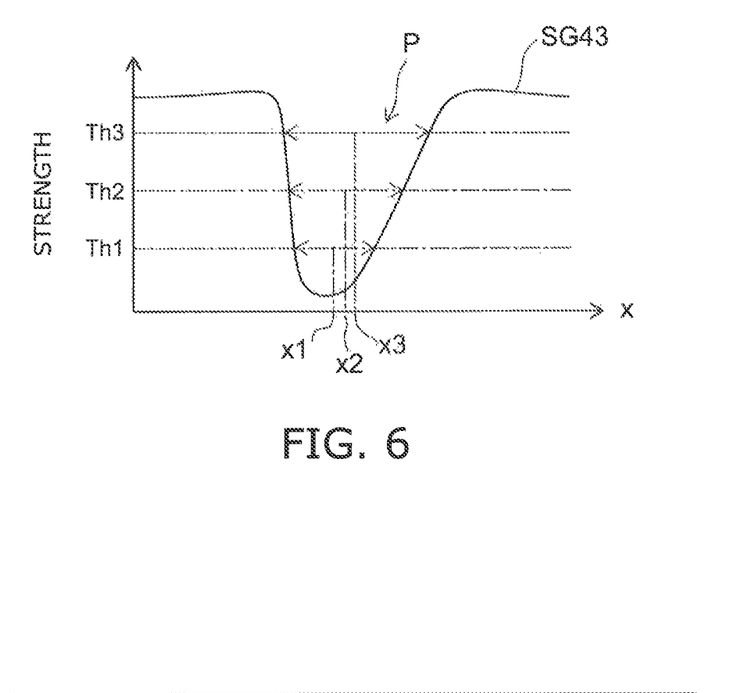
FIG. 6 is a schematic view illustrating the measurement of the position of the pattern.

FIG. 6 is a schematic view illustrating the measurement of the position of the pattern.

An example of the third signal SG43 of the pattern P is shown in FIG. 6. In FIG. 6, the horizontal axis is the x-direction position; and the vertical axis is the strength of the signal.

As shown in FIG. 6, the distortion of the third signal SG43 caused by the scanning direction of the electron beam is suppressed sufficiently. For example, the measurement unit 51 sets multiple thresholds of the strength of the signal for the third signal G43. Three thresholds Th1, Th2, and Th3 are set in the example shown in FIG. 6.

The measurement unit 51 determines center positions x1, x2, and x3 for the intersections between the third signal SG43 and the thresholds Th1, Th2, and Th3. Then, the average of the center positions x1, x2, and x3 is determined. The measurement unit 51 outputs the average of the center positions as the center position of the pattern P.

Also, the measurement unit 51 can measure the degree of asymmetry of the pattern P with high precision by using the signal for which the distortion caused by the scanning direction of the electron beam is suppressed.

Figure 7:
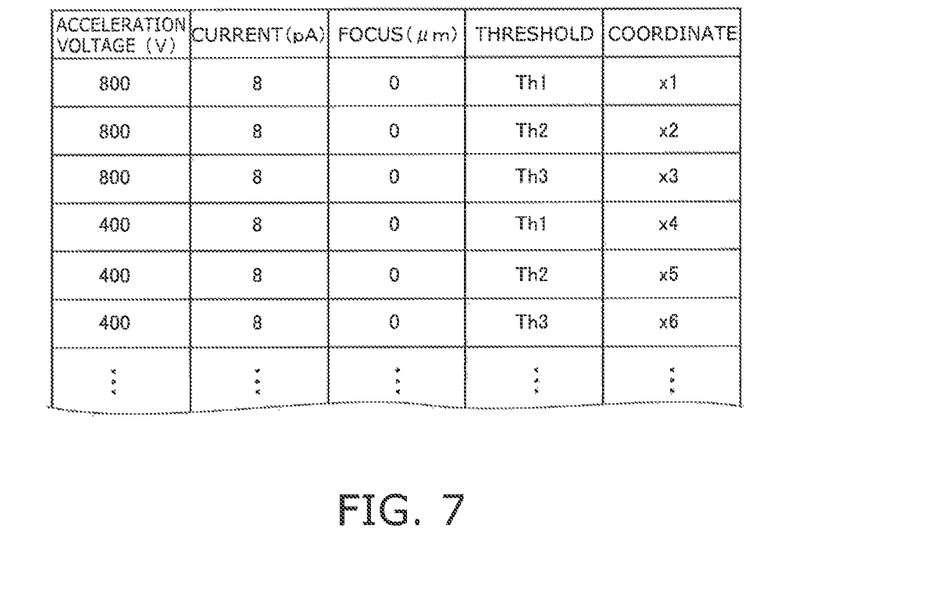
FIG. 7 illustrates the degree of asymmetry of the pattern.

FIG. 7 illustrates the degree of asymmetry of the pattern.

In the pattern measurement apparatus 110 according to the embodiment as shown in FIG. 7, multiple third signals are obtained by acquiring image using multiple irradiation conditions for the electron beam. In FIG. 7, the acceleration voltage and current of the electron gun 11 and the focus position due to the condenser lens 12 are used as the irradiation conditions. The coordinate of the position of the pattern is determined by applying multiple thresholds to the third signal for these irradiation conditions.

The degree of asymmetry of the pattern is determined quantitatively by, for example, the following formula by utilizing analysis of variance based on the values of the irradiation conditions shown in FIG. 7 and the positions of the pattern.

$$X_{ijklm} = a \times \text{acceleration voltage}_i + b \times \text{current}_j + c \times \text{focus}_k + d \times \text{threshold}_l + e \times \text{coordinate}_m$$

Here, a, b, c, d, and e are coefficients.

Based on the formula recited above, the degree of asymmetry can be determined at all of the measurement conditions. Accordingly, a high-precision measurement value for which the effects of the asymmetry of the pattern are excluded can be obtained by using the degree of asymmetry for one measurement condition and the measurement value for that condition.

The pattern measurement apparatus 110 according to the embodiment may include only the image signal processor 20 shown in FIG. 1. The image signal processor 20 acquires the image signal acquired by the scanning electron microscope 10. The image signal may be transmitted directly to the image signal processor 20 from the scanning electron microscope 10; or the image signal may be transmitted from a server that stores the image signal. Also, the image signal may be transmitted to the image signal processor 20 via a network.

Second Embodiment

A pattern measurement method according to a second embodiment will now be described.

Figure 8:
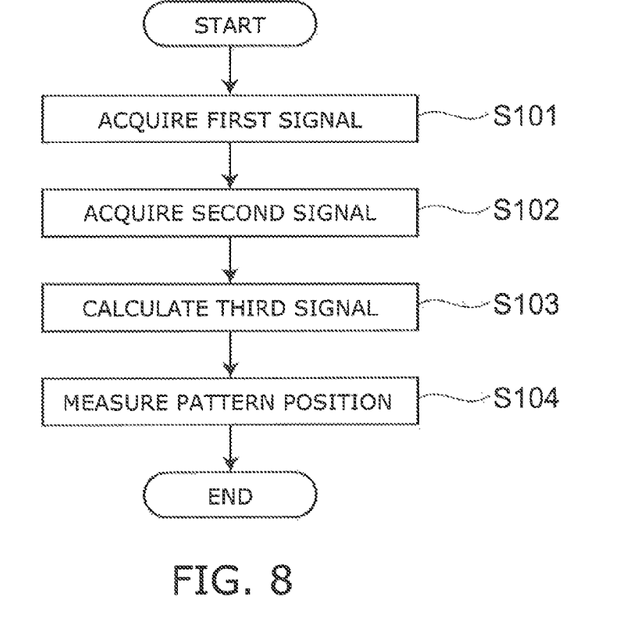
FIG. 8 is a flowchart illustrating the pattern measurement method according to the second embodiment.

FIG. 8 is a flowchart illustrating the pattern measurement method according to the second embodiment.

As shown in FIG. 8, the pattern measurement method according to the embodiment includes a process of obtaining the first signal (step S101), a process of obtaining the second signal (step S102), a process of calculating the third signal (step S103), and a process of measuring the position of the pattern (step S104). The pattern measurement method according to the embodiment is a method for measuring the position of the pattern using the pattern measurement apparatus 110 according to the embodiment described above.

In the acquisition of the first signal shown in step S101, at least one first signal is obtained based on the secondary electrons obtained by irradiating the electron beam onto the pattern P by scanning the electron beam in the first direction D1.

In the acquisition of the second signal shown in step S102, at least one second signal is obtained based on the secondary electrons obtained by irradiating the electron beam onto the pattern P by scanning the electron beam in the second direction D2 that is opposite to the first direction D1.

In the calculation of the third signal shown in step S103, at least one third signal for which the difference of signals caused by the scanning direction of the electron beam is suppressed is determined from the first signal and the second signal.

In the measurement of the position of the pattern shown in step S104, the position of the pattern P is measured from the third signal. For example, the third signal is determined by averaging the first signal and the second signal.

The pattern formation method according to the embodiment may further include a process of determining the degree of asymmetry of the pattern from the third signal.

In the measurement of the position of the pattern shown in step S104, multiple thresholds may be set for the signal strength of the third signal; multiple center positions may be determined for the third signal using the multiple thresholds; and the position of the pattern may be determined based on the multiple center positions.

In the process of determining the third signal shown in step S103, multiple third signals may be determined from multiple first signals and multiple second signals that are obtained using mutually-different multiple irradiation conditions of the electron beam. In the pattern measurement method according to the embodiment, the degree of asymmetry of the pattern may be determined from the multiple third signals.

Here, the processing of step S101 to step S104 is performed by the image signal processor 20 shown in FIG. 1. The processing of each step is similar to the processing by the signal processor 31 and the measurement unit 51 described above.

The pattern measurement method described above is realizable as a program (a pattern measurement program) that is executed by a computer.

Figure 9:
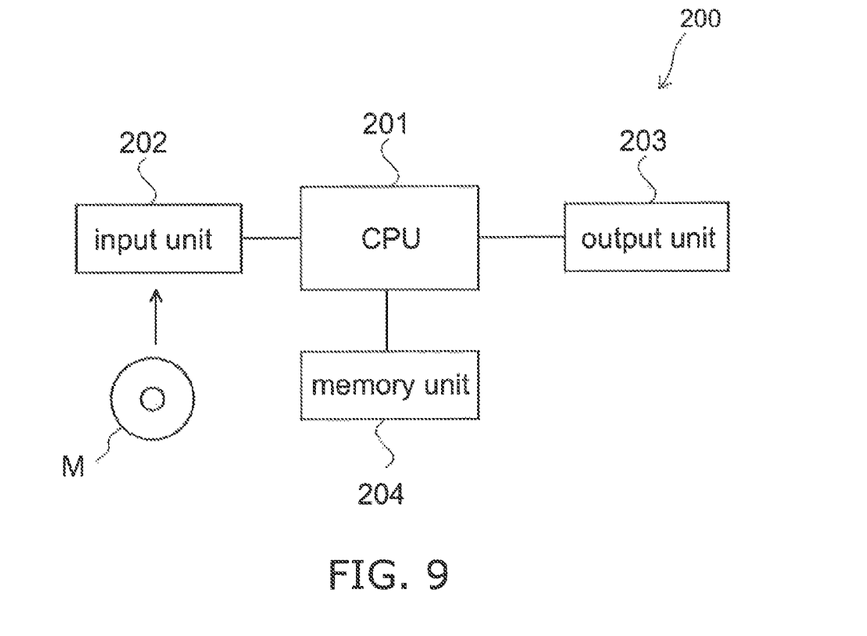
FIG. 9 illustrates the hardware configuration of a computer.

FIG. 9 illustrates the hardware configuration of a computer.

The computer 200 includes a central processing unit 201, an input unit 202, an output unit 203, and a memory 204. The input unit 202 functions to read information recorded in a recording medium M. The pattern measurement program is executed by the central processing unit 201.

The pattern measurement program causes the computer 200 to execute the processing of step S101 to step S104 shown in FIG. 8.

The pattern measurement program may be recorded in a computer-readable recording medium. The recording medium M stores the processing of step S101 to step S104 shown in FIG. 8 in a format that is readable by the computer 200. The recording medium M may be a memory device such as a server or the like that is connected to a network. Also, the pattern measurement program may be distributed via the network.

As described above, according to the pattern measurement apparatus and the pattern measurement method according to the embodiments, the position of the pattern can be measured with high precision based on the signal obtained by the scanning electron microscope.

Although the embodiment and modifications thereof are described above, the invention is not limited to these examples. For example, additions, deletions, or design modifications of components or appropriate combinations of the features of the embodiments appropriately made by one skilled in the art in regard to the embodiments or the modifications thereof described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern measurement apparatus, comprising:
a scan controller configured to control a scanning direction of an electron beam;
a focus controller configured to control a focus position of the electron beam;
a stage configured to have a substrate placed on the stage, a pattern being provided in the substrate;
a sensor configured to sense secondary electrons due to the electron beam irradiated onto the pattern;
a signal processor configured to process a signal sensed by the sensor; and
a measurement unit,
the signal processor being configured to determine at least one of third signals from at least one of first signals and at least one of second signals, the first signals being obtained by the sensor by the electron beam being scanned by the scan controller in a first direction, the second signals being obtained by the sensor by the electron beam being scanned by the scan controller in a second direction opposite to the first direction, a signal difference caused by the scanning direction of the electron beam being suppressed for the third signals,
the measurement unit being configured to measure a position of the pattern from the third signals.

2. The apparatus according to claim 1, wherein the third signals are signals obtained by averaging the first signals and the second signals.

3. The apparatus according to claim 2, wherein the measurement unit is configured to determine a degree of asymmetry of the pattern from the third signals.

4. The apparatus according to claim 2, wherein the measurement unit is configured to set a plurality of thresholds for a signal strength, determine a plurality of center positions for the third signals using the thresholds, and determine the position of the pattern based on the center positions.

5. The apparatus according to claim 2, wherein the signal processor is configured to determine a plurality of the third signals from a plurality of the first signals and a plurality of the second signals, the plurality of first signals and the plurality of second signals being obtained using a mutually-different plurality of irradiation conditions of the electron beam.

6. The apparatus according to claim 5, wherein the measurement unit is configured to determine a degree of asymmetry of the pattern from the plurality of third signals.

7. The apparatus according to claim 1, wherein the measurement unit is configured to determine a degree of asymmetry of the pattern from the third signals.

8. The apparatus according to claim 7, wherein the measurement unit is configured to set a plurality of thresholds for a signal strength, determine a plurality of center positions for the third signals using the thresholds, and determine the position of the pattern based on the center positions.

9. The apparatus according to claim 7, wherein the signal processor is configured to determine a plurality of the third signals from a plurality of the first signals and a plurality of the second signals, the plurality of first signals and the plurality of second signals being obtained using a mutually-different plurality of irradiation conditions of the electron beam.

10. The apparatus according to claim 9, wherein the measurement unit is configured to determine a degree of asymmetry of the pattern from the plurality of third signals.

11. The apparatus according to claim 1, wherein the measurement unit is configured to set a plurality of thresholds for a signal strength, determine a plurality of center positions for the third signals using the thresholds, and determine the position of the pattern based on the center positions.

12. The apparatus according to claim 11, wherein the signal processor is configured to determine a plurality of the third signals from a plurality of the first signals and a plurality of the second signals, the plurality of first signals and the plurality of second signals being obtained using a mutually-different plurality of irradiation conditions of the electron beam.

13. The apparatus according to claim 1, wherein the signal processor is configured to determine a plurality of the third signals from a plurality of the first signals and a plurality of the second signals, the plurality of first signals and the plurality of second signals being obtained using a mutually-different plurality of irradiation conditions of the electron beam.

14. The apparatus according to claim 13, wherein the measurement unit is configured to determine a degree of asymmetry of the pattern from the plurality of third signals.

15. A pattern measurement method using an apparatus including:
a scan controller configured to control a scanning direction of an electron beam,
a focus controller configured to control a focus position of the electron beam,
a stage configured to have a substrate placed on the stage, a pattern being provided in the substrate,
a sensor configured to sense secondary electrons due to the electron beam irradiated onto the pattern, and
a signal processor configured to process a signal sensed by the sensor, and
configured to measure a position of the pattern based on the signal sensed in the sensing of the secondary electrons due to the electron beam irradiated onto the pattern, the method comprising:
obtaining at least one of first signals based on the secondary electrons obtained by irradiating the electron beam onto the pattern by scanning the electron beam in a first direction;
obtaining at least one of second signals based on the secondary electrons obtained by irradiating the electron beam onto the pattern by scanning the electron beam in a second direction opposite to the first direction;
obtaining at least one of third signals being determined from the first signals and the second signals, a signal difference caused by a scanning direction of the electron beam being suppressed for the third signals; and
measuring the position of the pattern from the third signals.

16. The method according to claim 15, wherein the third signals are signals obtained by averaging the first signals and the second signals.

17. The method according to claim 15, further comprising determining a degree of asymmetry of the pattern from the third signals.

18. The method according to claim 15, wherein the measuring of the position of the pattern includes setting a plurality of thresholds for a signal strength, determining a plurality of center positions for the third signals using the thresholds, and determining the position of the pattern based on the center positions.

19. The method according to claim 15, wherein the determining of at least one of the third signals includes determining a plurality of the third signals from a plurality of the first signals and a plurality of the second signals, the first signals and the second signals being obtained using a mutually-different plurality of irradiation conditions of the electron beam.

20. The method according to claim 19, wherein the measuring of the position of the pattern includes determining a degree of asymmetry of the pattern from the third signals.

* * * * *